(12) United States Patent
Yoon et al.

(10) Patent No.: US 8,355,279 B2
(45) Date of Patent: Jan. 15, 2013

(54) NONVOLATILE MEMORY DEVICE AND SYSTEM, AND METHOD OF PROGRAMMING A NONVOLATILE MEMORY DEVICE

(75) Inventors: Sangyong Yoon, Seoul (KR); Jinman Han, Seongnam-si (KR); Kitae Park, Seongnam-si (KR); Joon Young Kwak, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 251 days.

(21) Appl. No.: 12/882,378

(22) Filed: Sep. 15, 2010

(65) Prior Publication Data

US 2011/0075478 A1    Mar. 31, 2011

(30) Foreign Application Priority Data

Sep. 25, 2009   (KR) .................. 10-2009-0091233

(51) Int. Cl.
*G11C 16/06* (2006.01)
*G11C 16/04* (2006.01)
(52) U.S. Cl. ............... 365/185.03; 365/185.24
(58) Field of Classification Search ............. 365/185.03, 365/185.24
See application file for complete search history.

(56) References Cited

U.S. PATENT DOCUMENTS

| 5,754,566 A | 5/1998 | Christopherson et al. |
| 2009/0187368 A1* | 7/2009 | Jain ............................... 702/119 |
| 2009/0190397 A1* | 7/2009 | Cho et al. ................. 365/185.03 |

FOREIGN PATENT DOCUMENTS

| JP | 2008-065939 | 3/2008 |
| KR | 1020080088050 A | 10/2008 |

* cited by examiner

*Primary Examiner* — Hoai V Ho
*Assistant Examiner* — Tri Hoang
(74) *Attorney, Agent, or Firm* — Volentine & Whitt, PLLC

(57) ABSTRACT

A nonvolatile memory includes a plurality of N-bit multi-level cell (MLC) memory cells and a controller. The plurality of N-bit MLC memory cells are for storing N pages of data, each of the MLC memory cells programmable into any one of $2^N$ threshold voltage distributions, where N is a positive number. The controller is configured to program the N pages of data into the MLC memory cells, and to execute a partial interleave process in which the N pages of data are divided into M page groups, where M is a positive number and where each page group includes at least one of the N pages of data, and in which each of the M page groups is applied to an error correction code (ECC) circuit to generate parity bits for the respective M page groups, where a bit-error rate (BER) among the pages within each of the M groups is equalized by the partial interleave process.

23 Claims, 19 Drawing Sheets

| State<br>Page | E | P1 | P2 | P3 | BER |
|---|---|---|---|---|---|
| Page1<br>(LSB) | 1 | 1 | 0 | 0 | 1 |
| Page2<br>(MSB) | 1 | 0 | 0 | 1 | 2 |

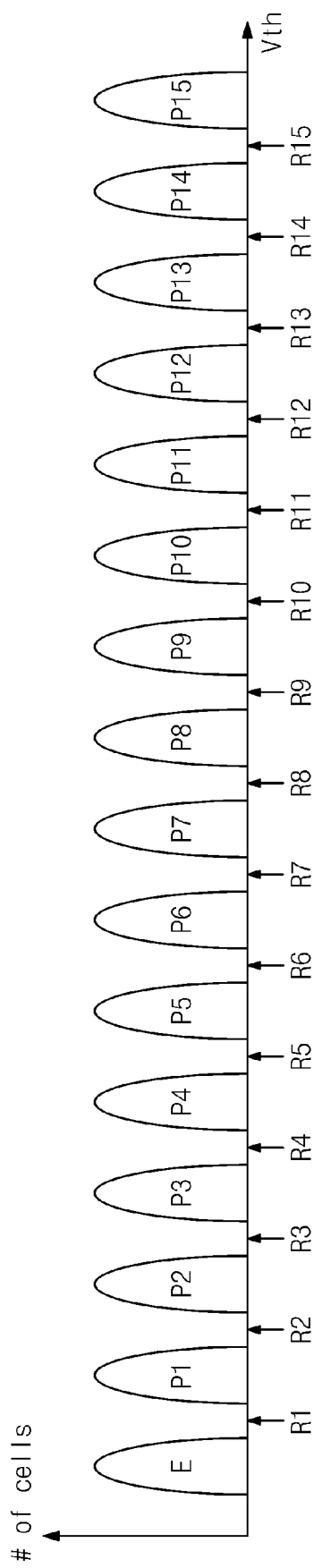

NONVOLATILE MEMORY DEVICE AND SYSTEM, AND METHOD OF PROGRAMMING A NONVOLATILE MEMORY DEVICE

CROSS-REFERENCE TO RELATED APPLICATION(S)

A claim of priority is made to Korean Patent Application No. 10-2009-0091233, filed on Sep. 25, 2009, in the Korean Intellectual Property Office, the disclosure of which is incorporated herein in its entirety by reference.

BACKGROUND

The inventive concepts described herein relate to nonvolatile memory devices and to method of operating the same, and more particularly, to nonvolatile flash memory devices including error correction coding (ECC) functionality and to method of operating flash memory devices including ECC functionality.

FIG. 1 schematically illustrates an example of a memory block BLK1 of a NAND flash memory cell array in which a plurality of nonvolatile memory cells are coupled at respective intersections of word lines WL<0:31> and bit lines BL<1:m>. The memory cells are connected in series to one of the bit lines BL to define a memory cell "string", with each string commonly connected to a common source line CSL. Further, each string includes a ground select line GSL transistor and a string select line SSL transistor at opposite ends thereof. The data stored in the memory cells of each word line WL constitute a page 1111 of data. As discussed later herein, in the case of multi-level cell (MLC) memory devices, each word line WL stores multiple pages of data.

FIG. 2 is a block diagram schematically illustrating an example of a nonvolatile memory device. As shown, the nonvolatile memory 1100 includes a nonvolatile memory cell array 1110, an address decoder 1130, a data input/output (I/O) circuit 1120, and a control logic and high voltage generator 1140. The address decoder 1130 is responsive to the control logic and high voltage generator 1130 to decode a read/write address ADDR and to apply program/read voltages, etc., to selected addressed word lines WL of the nonvolatile memory cell array 1110. The data I/O circuit 1120 also responsive to the control logic and high voltage generator 1130, and includes, for example, bit line BL selection circuitry, write drivers, and read circuitry associated with the input and output of data (DATA). The control logic and high voltage generator controls an overall operation of the nonvolatile memory 1100, and generates the relative high voltages needed in programming memory cells of the memory cell array 1110. The memory cell array 1110 includes a plurality of memory blocks BLK <1:n>, such as the memory block BLK1 shown in FIG. 1.

Multi-level cell (MLC) memory devices are characterized by to programming of two (2) or more bits of stored data in each single memory cell. In the case of an N-bit MLC flash memory device (where N is a positive integer), this is accomplished by setting the threshold voltage (e.g., through Fowler-Nordheim tunneling) of each memory cell to within one of $2^N$ threshold distributions.

FIG. 3 illustrates threshold voltage distributions in the example of a 2-bit MLC flash memory device. As shown, the threshold voltage of each memory cell is set to one of four threshold voltage distribution states, namely, an erased state E, or one of programmed states P1, P2 and P3. As also shown, the threshold voltage distribution states E, P1, P2 and P3 are assigned stored data bits of '11', '10', '00', and '01', respectively.

Generally, each bit of the MLC memory cells has a separate page address. For example, in a 2-bit MLC memory cell, the stored least significant bits (LSB) of the cells of a word line constitute a first page of data, and the stored most significant bits (MSB) of the cells of the word line constitute a second page of data. Thus, the N-bit MLC memory cells (where N is two or more) connected to a given word line stores N pages of data.

MLC memory devices have been developed in response to the demand for higher integration. However, as is apparent from FIG. 2, the gaps between threshold voltage distributions of the MLC memory cells is reduced as the number of bits (N) increases, which can have a negative impact on read margins. As such, a memory controller, which interfaces between a host and the flash memory device, may be equipped with an error correction code (ECC) circuit configured to detect and correct errors in data read from the MLC memory cells. Error probability increases in proportion to the number of data bits stored in each memory cell, and thus, the resources devoted to the complexity, size and operating time of ECC circuit can substantially increase in MLC memory devices.

SUMMARY

According to an aspect of the inventive concepts, a nonvolatile memory is provided which includes a plurality of N-bit multi-level cell (MLC) memory cells and a controller. The plurality of N-bit MLC memory cells are for storing N pages of data, each of the MLC memory cells programmable into any one of $2^N$ threshold voltage distributions, where N is a positive number. The controller is configured to program the N pages of data into the MLC memory cells, and to execute a partial interleave process in which the N pages of data are divided into M page groups, where M is a positive number and where each page group includes at least one of the N pages of data, and in which each of the M page groups is applied to an error correction code (ECC) circuit to generate parity bits for the respective M page groups, where a bit-error rate (BER) among the pages within each of the M groups is equalized by the partial interleave process.

According to another aspect of the inventive concepts, a method of setting threshold voltage distributions in a nonvolatile memory is provided. The nonvolatile memory includes N-bit multi-level cell (MLC) memory cells for storing N pages of data, each of the N-bit MLC memory cells programmable into any one of $2^N$ threshold voltage distributions. The method dividing the N pages into M groups of pages, and setting 2N−1 verify voltages associated with the $2^N$ threshold voltage distributions to equalize the average bit-error-rate (BER) of the M groups of pages.

According to another aspect of the inventive concepts, a memory system is provided which includes a nonvolatile memory and a memory controller. The nonvolatile memory includes a control logic, an address decoder, and a memory cell array. The memory cell array including rows and columns of N-bit multi-level cell (MLC) memory cells, where each row of MLC memory cells is configured to stored N pages of data. The memory controller includes a host interface for interfacing with an external device, a memory interface for interfacing with the nonvolatile memory, a central processing unit, a buffer memory, and an error correction code (ECC) circuit. The memory controller is configured to execute a partial interleave process in which the N pages of data are divided into M page groups, where M is a positive number and where each page group includes at least one of the N pages of data, and in which each of the M page groups is applied to the ECC circuit to generate parity bits for the respective M page groups, where a bit-error rate (BER) among the pages within each of the M groups is equalized by the partial interleave process.

BRIEF DESCRIPTION OF THE DRAWINGS

The above and other aspects of the inventive concepts will become readily apparent from the detailed description that follows, with reference to the accompanying drawings, in which:

FIG. 7 is a threshold voltage diagram of a 4-bit MLC flash memory device;

FIG. 8 is a table illustrating relative BERs for pages of a 4-bit MLC flash memory device;

DETAILED DESCRIPTION OF THE EMBODIMENTS

Various example embodiments of the inventive concepts are described below with reference to the accompanying drawings, where like reference numbers are used to denote like or similar elements. The inventive concepts may, however, be embodied in many different forms and are not to be construed as limited to the embodiments set forth herein.

To facilitate understanding, a number of non-limiting descriptive terms may be utilized which are not intended to define the scope of the inventive concepts. For example, although the terms "first", "second", etc. may be used herein to describe various elements, these elements should not be limited by these terms. These terms are simply used to distinguish one element from another. For example, a first element could be termed a second element, and, similarly, a second element could be termed a first element, without departing from or limiting the scope of the inventive concepts. Likewise, the words "over", "under", "above", "below", etc. are relative terms which are not intended to limit the inventive concepts to a particular device orientation. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
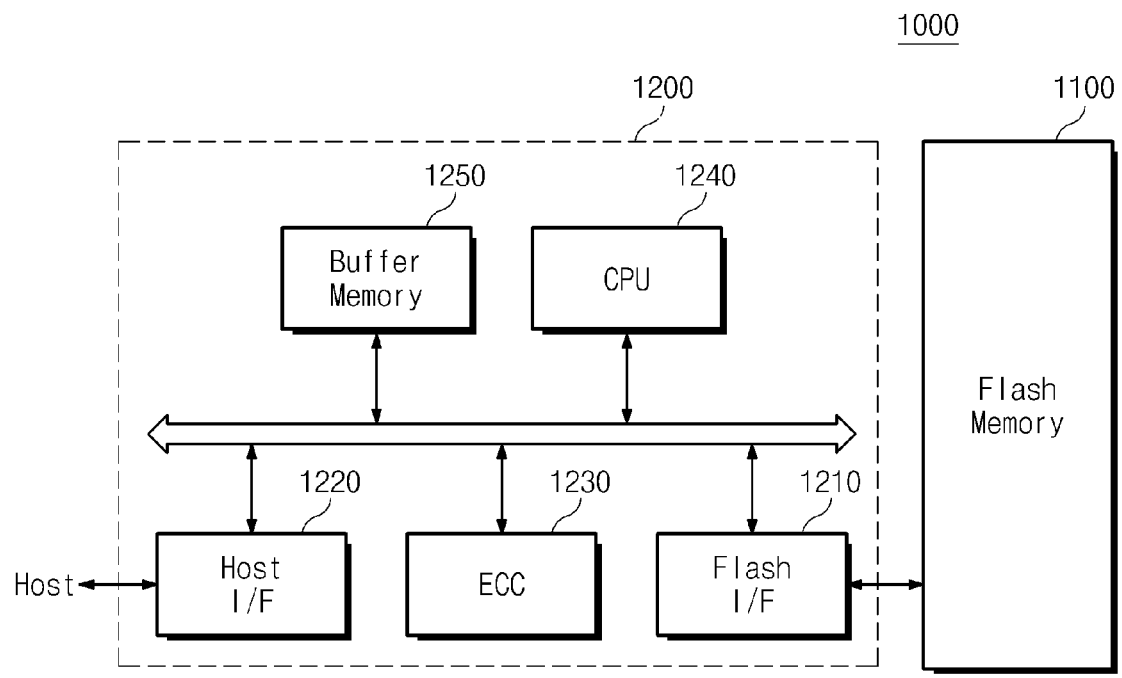
FIG. 4 is a block diagram of a memory controller according to an embodiment of the inventive concepts.

FIG. 4 is a block diagram of a memory system 1000 which may be utilized to implement embodiments of the inventive concepts. The memory system 1000 may, for example, be a an multimedia card (MMC) card, a Secure Digital (SD) card, a micro SD card, a memory stick, an ID card, a PCMCIA card, a chip card, a USB card, a smart card, and a Compact Flash (CF) card.

Figure 1:
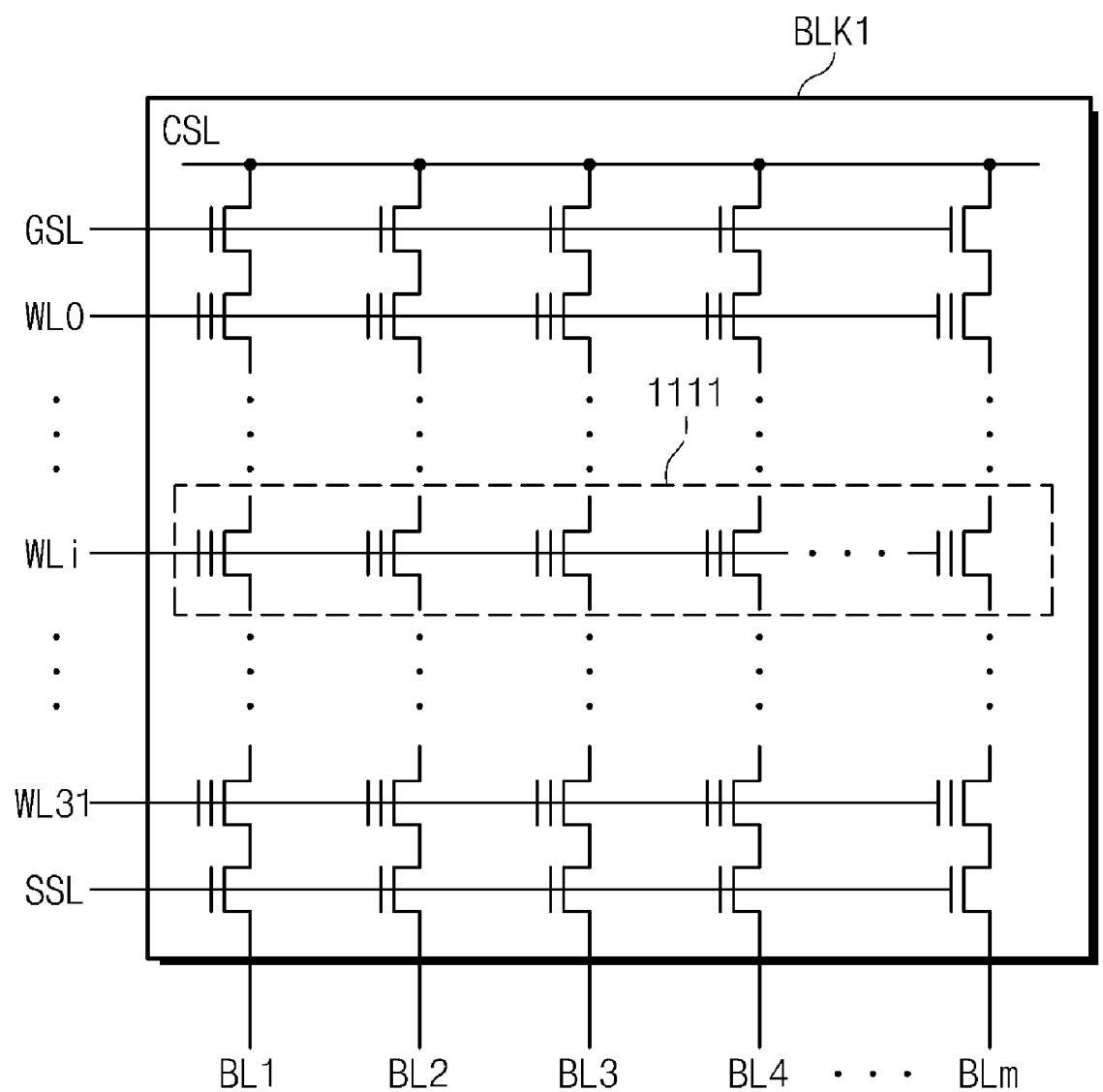
FIG. 1 is a schematic diagram of a nonvolatile memory array.
Figure 2:
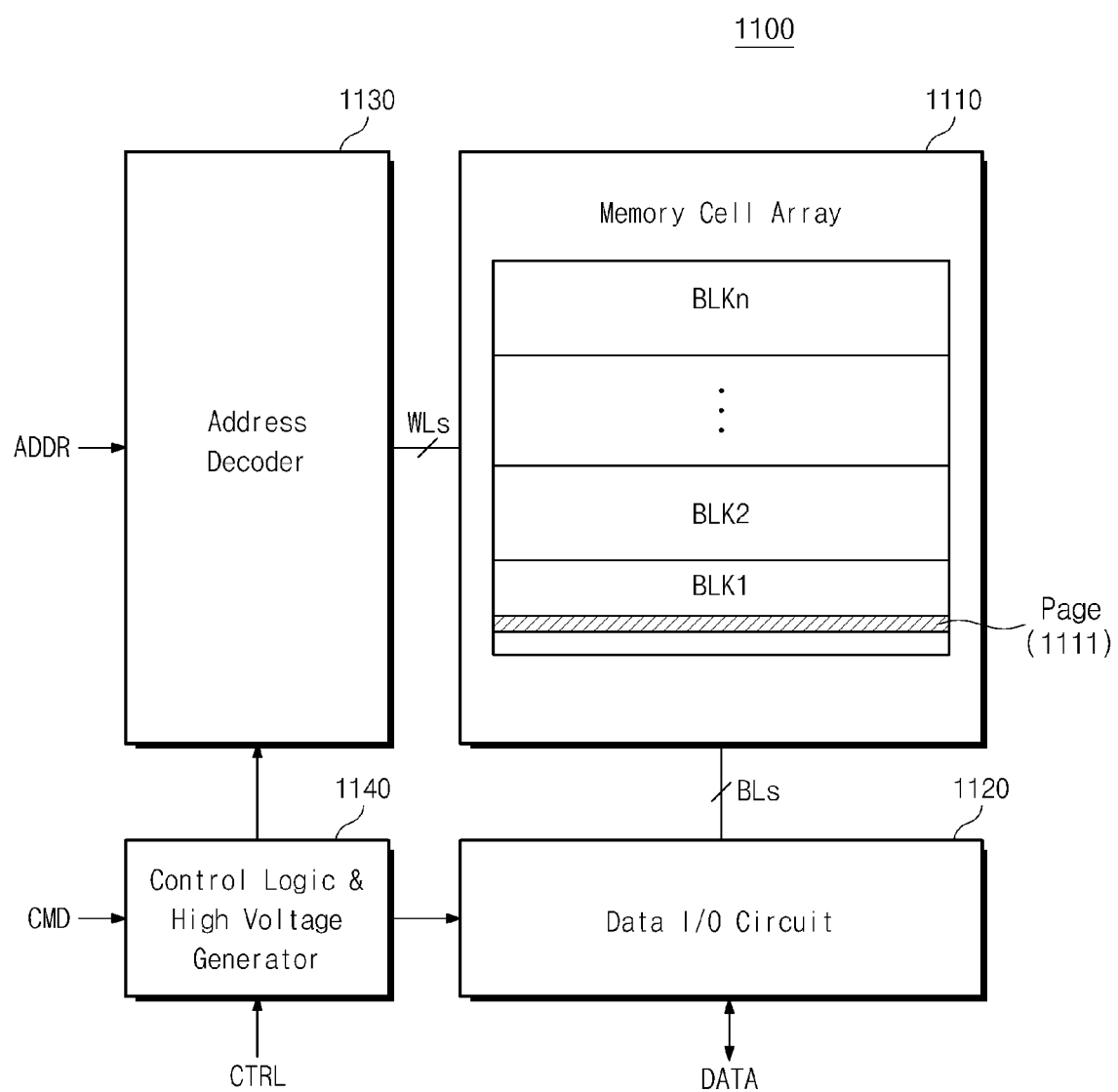
FIG. 2 is a block schematic diagram illustrating a multi-level cell (MLC) flash memory device.

The memory system 1000 includes a nonvolatile memory device 1100 and a memory controller 1200. In this example, the nonvolatile memory device 1100 is a flash memory having MLC memory cells, such as that depicted in FIG. 2 described above.

The memory controller 1200 is configured to control the nonvolatile memory device 1100 via a flash interface (I/F) 1210. Further, the memory controller 1200 communicates with an external device (for example, the host device) via a host I/F 1220 using any one of various interface protocols such as a Universal Serial Bus (USB) protocol, a Multimedia Card (MMC) protocol, a Peripheral Component Interconnection (PCI) protocol, a PIC-Express (PCI-E) protocol, an Advanced Technology Attachment (ATA) protocol, a Serial-ATA protocol, a Parallel-ATA protocol, a Small Component Small Interface (SCSI) protocol, an Enhanced Small Disk Interface (ESDI) protocol, a Integrated Drive Electronics (IDE) protocol and an E-IDE protocol.

A buffer memory 1250 of the memory controller 1200 functions as an input/output buffer which temporarily stores data to be written ("write data") to the flash memory 1100 and data to be read ("read data") from the flash memory 1100. Generally, a data transfer rate of the bus protocol (for example, SATA or SAS) of the host device is far higher than a data transfer rate to and from the flash memory 1100. The buffer memory 1250 is provided to accommodate and manage this difference in data transfer rates.

An Error Correction Code (ECC) block 1230 of the memory controller 1230 detects and corrects data read errors that are read from the nonvolatile memory device 1100. A variety of ECC protocols are known in the art, and the inventive concepts are not limited in this respect. Generally, the EEC block may function to create parity bits based on the bit logic states of write data, and associate those parity bits with the written data in the flash memory 1100. Then, in a read operation, the parity bits are utilized to detect errors in the data as it is read from the flash memory 1100.

A central processing unit (CPU) 1240 of the memory controller 1200 controls an overall operation for the data exchange executed by the memory controller 1200. Although not shown, it will be apparent to those skilled in the art that the memory controller may be further provided with other components, such as a ROM (not shown) which stores code data for interfacing with the host device. Further, the controller 1200 may be equipped with multiple CPU's to allow for multitasking and high-speed parallel processing.

Figures 5, 6:
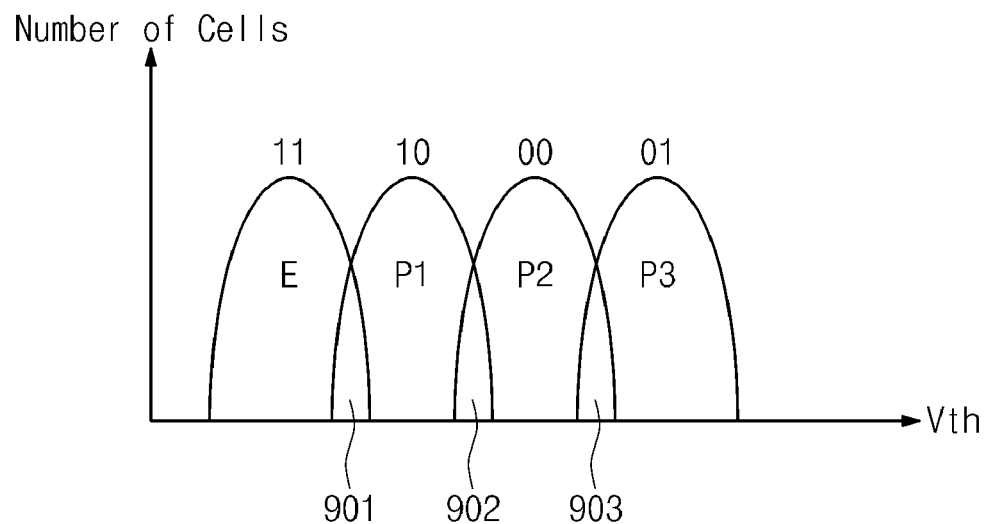
FIG. 5 is a threshold voltage distribution diagram for use in describing a bit error rate (BER) in an MLC flash memory device.
FIG. 6 is a table illustrating relative BERs for pages of a 2-bit MLC flash memory device.

Attention is directed to FIGS. 5 and 6 for an explanation of the bit-error rate associated with a 2-bit MLC flash memory. FIG. 5 depicts a voltage distribution (number of cells versus threshold voltage Vth) of 2-bit flash memory cells. As shown, the voltage distributions include an erased state E, and program states P1, P2 and P3. In the example shown in FIG. 5, the 2-bit logic values (i.e., 2-bit data) 11, 10, 00, 01 are assigned to the respective voltage distributions E, P1, P2, P3.

Figure 3:
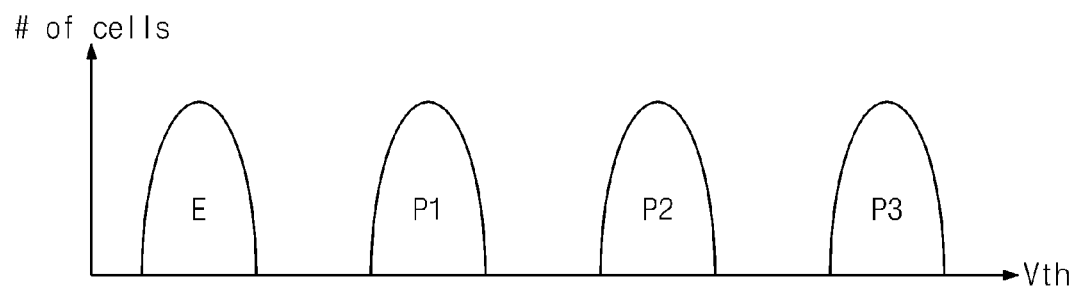
FIG. 3 is a threshold voltage distribution diagram for use in describing a multilevel cell (MLC) flash memory device.

In MCL flash memory, each bit of data per memory cell constitutes a logical page of data. In the case of 2-bit MLC, the least significant bits LSB of the stored data may be a first page of data, and the most significant bits MSB of stored data may be a second page of data. This is shown in FIG. 6. In an actual real-world flash memory device, the threshold voltage distributions are not ideal such as shown in FIG. 3 above, but instead a portion of each threshold distribution overlaps an adjacent threshold voltage distribution. This is represented in FIG. 5 by the overlapping region 901 of distribution states E and P1, the overlapping region 902 of distribution states P1 and P2, and the overlapping regions 903 of distribution states P2 and P3. In reading the first (LSB) data page, a read voltage is applied which is centrally located between the voltages of the distribution states P1 and P2. However, memory cells having threshold voltages within the overlapping portion 902 may be incorrectly read. This is because memory cells of the threshold voltage distribution P1 may be incorrectly detected as having a threshold voltage above the read voltage, and memory cells of the threshold voltage distribution P2 may be incorrectly detected as having a threshold voltage below the read voltage.

Referring to the table of FIG. 6, the least significant bit LSB (i.e., Page 1) of the 2-bit data are 1, 1, 0, 0 for the respective voltage distributions E, P1, P2, P3, and the most significant bit MSB (Page 2) of the 2-bit data are 1, 0, 0, 1 for the respective voltage distributions E, P1, P2, P3. The normalized bit error rate (BER) of each page is defined by the number of 1-0 or 0-1 bit transitions (i.e., the number of read operations) among the threshold voltage distributions. In the example of FIG. 6, Page 1 has one such transition (from P1 to P2), and thus Page 1 has a normalized BER of 1. Page 2 has two such transitions (from E to P1, and from P2 to P3), and thus Page 2 has a normalized BER of 2.

The BER of a 4-bit flash memory will now be described with reference to FIGS. 7 and 8.

FIG. 7 schematically illustrates ideal threshold voltage distributions of 4-bit flash memory cells. As shown, the voltage distributions include an erased state E and programmed states P1~P15. FIG. 7 also illustrates read voltages R1~R15 applied in a read operation of the flash memory cells.

FIG. 8 illustrates the 4-bit logic values assigned to each of the erased state E and programmed states P1~P15 of FIG. 7. In reading the first page of data (Page 1), a single bit transition exists and a single read at R8 is executed. Thus, the normalized BER is 1. In reading Page 2, two bit transitions are present, two reads at R4 and R12 are executed, and the normalized BER is 2. In reading Page 3, four bit transitions are present, four reads at R2. R6. R10 and 14, and the normalized BER is 4. Lastly, in reading Page 4, eight transitions are present, eight reads at R1, R3, R5, R7, R9, R11, R13 and R15 are executed, and the normalized BER is 8.

As described above, the BER increases disproportionally with the number of bits (i.e., pages per word line) of the MLC flash memory device. Indeed, as can be seen in the examples given above, for an N-bit MLC memory device, the BER of each page is equal to $2^{n-1}$, where n denotes the page number from 1 to N. The ECC circuit (e.g., the ECC block 1230 of FIG. 4) of the memory controller must be configured for the worst-case BER. In the case of the 4-bit MLC flash memory of FIGS. 7 and 8, this means designing the ECC circuit for a BER of 8, even though Pages 1~3 have a BER of less than eight. The disproportionate increase in BER relative to the number of pages per bit line can require an excessive enlargement in the ECC capacity.

Figure 9:
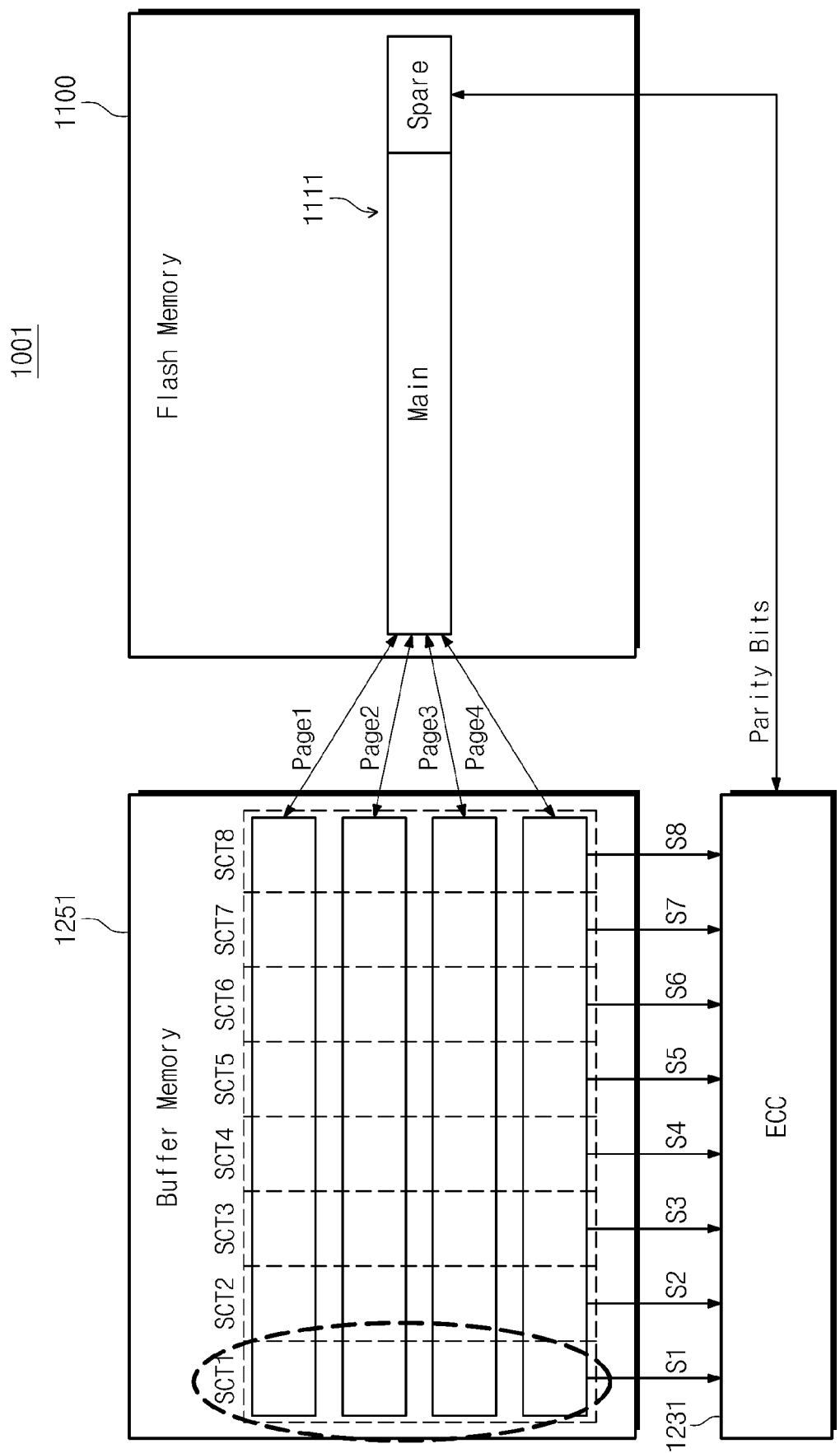
FIGS. 9 and 10 are diagrams for use in describing an interleave operation which may be utilized to reduce BER disproportion.
Figure 10:
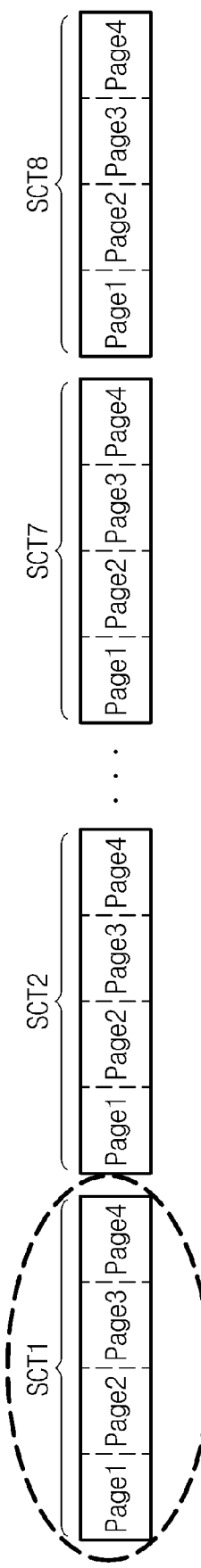

FIGS. 9 and 10 are diagrams for use in describing a interleave technique of the related art which may be utilized to reduce the worst-case BER of an MLC flash memory device.

In the example of a 4-bit MCL flash memory, this technique is characterized interleaving the data of four (4) pages (Pages 1~4) within each sector loaded (e.g., from a host) into a buffer memory 1251. Here, the buffer memory includes eight sectors SCT1~SCT8. The interleaved data of each sector of the buffer memory 1252 is utilized as sector data S1~S8 applied to an ECC circuit 1231, and the ECC circuit 1231 generates parity bits based on the interleaved data. The parity bits are then stored in a spare memory area of the flash memory 1100 so as to be associated with the page data 1111 stored therein. When the data is read, the ECC 1231 executes error correction of the physical pages based on the parity bits. In this manner, the pages of data all have the same BER. Namely, in the case of the 4-bit flash memory device, the BER is (1+2+4+8)/4=3.75.

While the interleave technique of the above example is effective to reduce the worst case BER from 8 to 3.75, significant buffer memory 1252 resources are needed for its implementation. This is at least in part because all four (4) pages of data must be loaded as a sector into the buffer memory 1251. For example, in the case where each page is capable of storing 512 bits, a sector of 2 KB may be allocated, and a large capacity buffer memory 1251 becomes necessary.

Another technique for equalizing BER disproportion is described next in connection with FIGS. 11-14. This technique relates to the disclosure of commonly assigned U.S. non-provisional application Ser. No. 12/081,453, filed Apr. 16, 2008.

Figure 11:
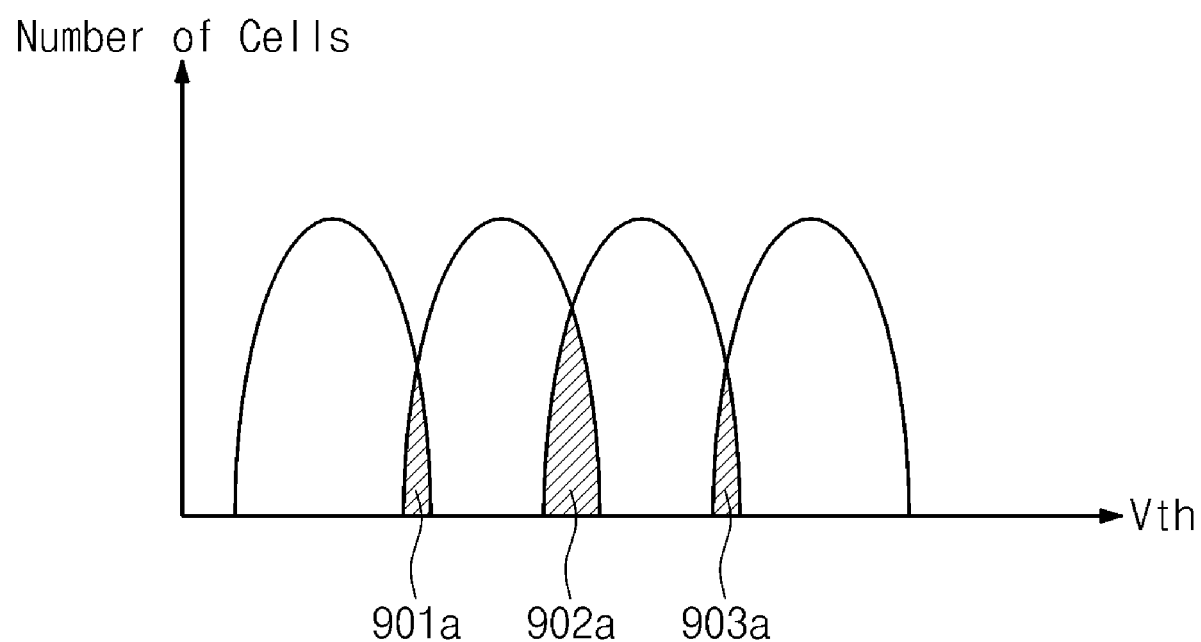
FIGS. 11 through 14 are diagrams for use in describing the shifting of threshold voltage distributions to reduce BER disproportion.

Referring FIG. 11, this technique involves shifting the gaps between threshold voltage distributions such the overlap at transitions for low BER pages is increased relative to the distribution overlap at transitions of high BER pages. For example, in FIG. 11, the threshold voltage distributions E, P1, P2 and P3 are shown for a 2-bit MLC flash memory device. In the previous example of FIG. 5, each of the overlap regions 901, 902 and 903 occupied the same area, i.e., the BER associated of each overlap region was the same. In contrast, the overlap region 902a of FIG. 11 occupies twice the area of each of the overlap regions 901a and 903a. Therefore, a BER associated with the overlap region 902a is twice a BER associated with each of the overlap regions 901a and 903a. Note here that the sum of the areas 901~903 is assumed to be the same as the sum of the areas 901a~902c, and thus the total BER of the two pages combined is the same. However, the BER of each page is the same since the first page includes a single read at the P1/P2, and the second page includes two reads at E/P1 and P2/P3. In this manner, in comparison with FIG. 5, the worst-case BER is reduced to the original average BER, namely, (1+2)/2=1.5.

Figure 12:
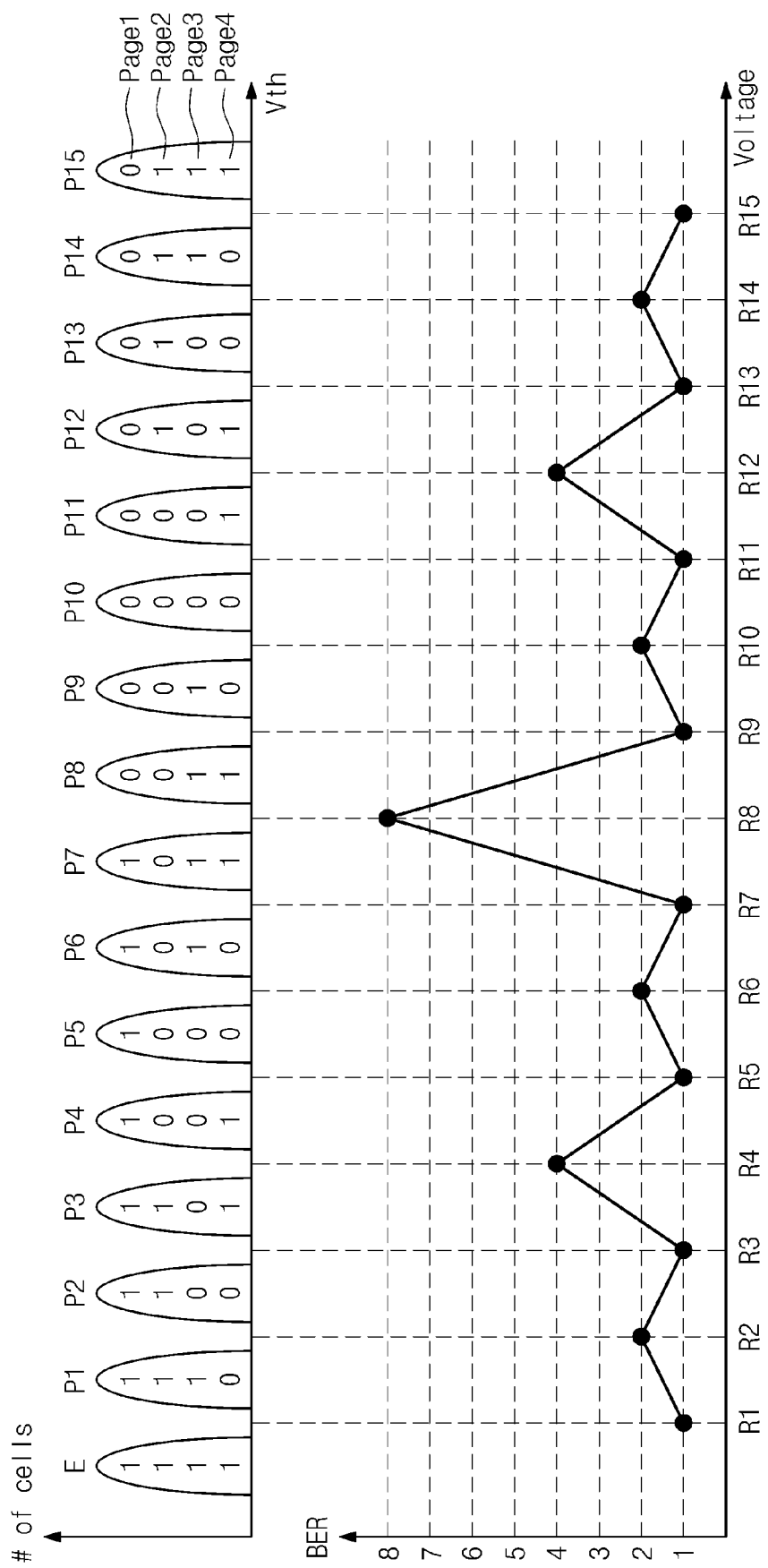

FIG. 12 is a diagram describing the threshold voltage Vt distribution adjustments in the case of a 4-bit MLC flash memory device. As shown, the gap between the threshold voltage Vt distributions P7 and P8 (i.e., the Page 1 read transition) is adjusted such that the BER (overlap area) is eight times that of the gap between E and P1, the gap between P2 and P3, the gap between P4 and P5, the gap between P6 and P7, the gap between P8 and P9, the gap between P10 and P11, the gap between P12 and P13, and the gap between P14 and P15 (i.e., the Page 4 read transitions). Also, as shown, the gap associated with the Page 1 transition is twice that associated with the Page 2 transitions, and four times that associated with the Page 3 transitions. In this manner, in comparison with FIG. 8, the worst-case BER is reduced to the original average BER, namely, (1+2+3+4)=3.75.

Adjusting the gaps (BER) between the threshold voltage Vt distributions can be realized by setting read verify voltages during a programming operation. This is shown by way of example in FIGS. 13 and 14.

Figure 13:
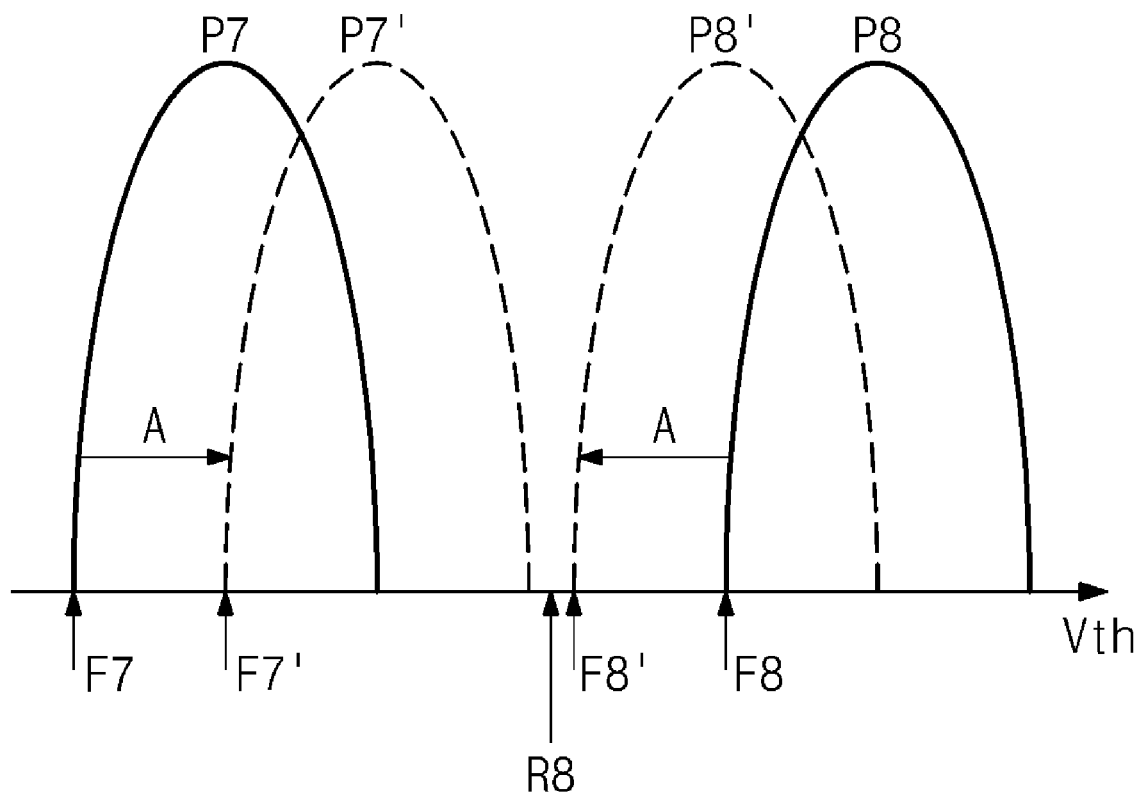

Referring to FIG. 13, normally positioned threshold voltage distributions P7 and P8 would result by executing a programming operation utilizing read verify voltages F7 and F8. In order to decrease the gap (increase BER) between threshold voltage distributions P7 and P8, the read verify voltage F7 can be increased by A to a new read verify voltage of F7', and the read verify voltage F8 can be decreased by A to a new read verify voltage of F8'. In this manner, the BER at the P7/P8 transition is increased.

Figure 14:
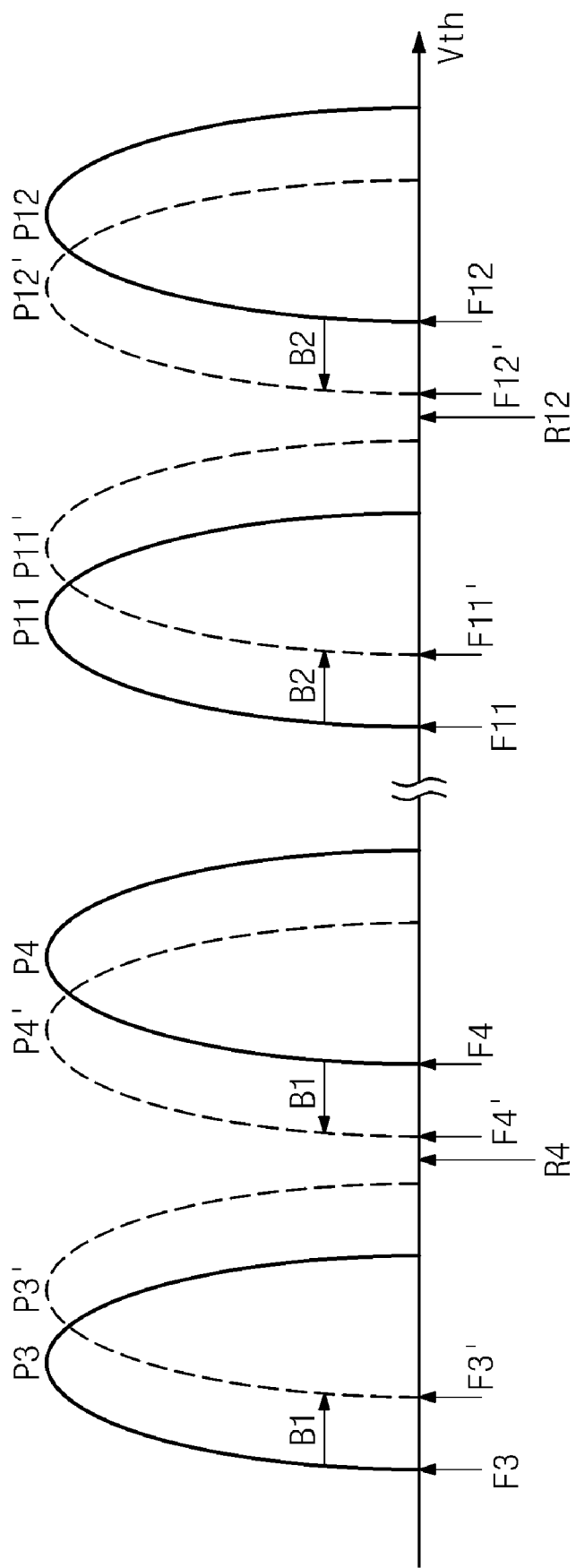

FIG. 14 is a similar diagram showing gap adjustment at the P3/P4 transition and the P11/P12 transition. Normally positioned threshold voltage distributions P3 and P3 would result by executing a programming operation utilizing read verify voltages F3 and F4. In order to decrease the gap (increase BER) between threshold voltage distributions P3 and P4, the read verify voltage F3 can be increased by B1 to a new read verify voltage of F3', and the read verify voltage F4 can be decreased by B1 to a new read verify voltage of F4'. In this manner, the BER at the P3/P4 transition is increased. Normally positioned threshold voltage distributions P11 and P12 would result by executing a programming operation utilizing read verify voltages F11 and F12. In order to decrease the gap (increase BER) between threshold voltage distributions P11 and P12, the read verify voltage F11 can be increased by B2 to a new read verify voltage of F11', and the read verify voltage F12 can be decreased by B2 to a new read verify voltage of F12'. In this manner, the BER at the P11/P12 transition is increased. Here, A>B1 and A>B2. Thus, the increase in BER at the P7/P8 transition is greater than those of the P3/P4 and P11/P12 transitions.

In a similar manner, the read verify voltages can be set to decrease the BER at the P1/P2, P5/P6, P9/P10 and P13/P14 transitions, and to further decrease the BER at the E/P1, P2/P3, P4/P5, P6/P7, P8/P9, P10/P11, P12/P13 and P14/P15 transitions.

Embodiments of the inventive concepts will now be described with reference to FIGS. 15 through 18. In the embodiments that follows, N-bit MLC memory cells are provided for storing N pages of data. The N pages of data are divided into M page groups, where each of the M page groups includes at least one of the N pages. In the examples that follow, each of the M page groups includes N/M pages. In a partial interleave process, the page data of each group is interleaved to generate sector data applied in an error correction code (ECC) process in order generate parity bits for each group, to thereby equalized a bit error rate (BER) (or reduce a disproportion in BER) of the pages within each group. Further, adjustments in voltage threshold Vt distributions are carried out to equalize the BER (or reduce a disproportion in BER) of the M groups of pages. Specific examples of the embodiments are described below in the case where N=4, and M=2, but the inventive concepts are not limited thereto.

Figure 15:
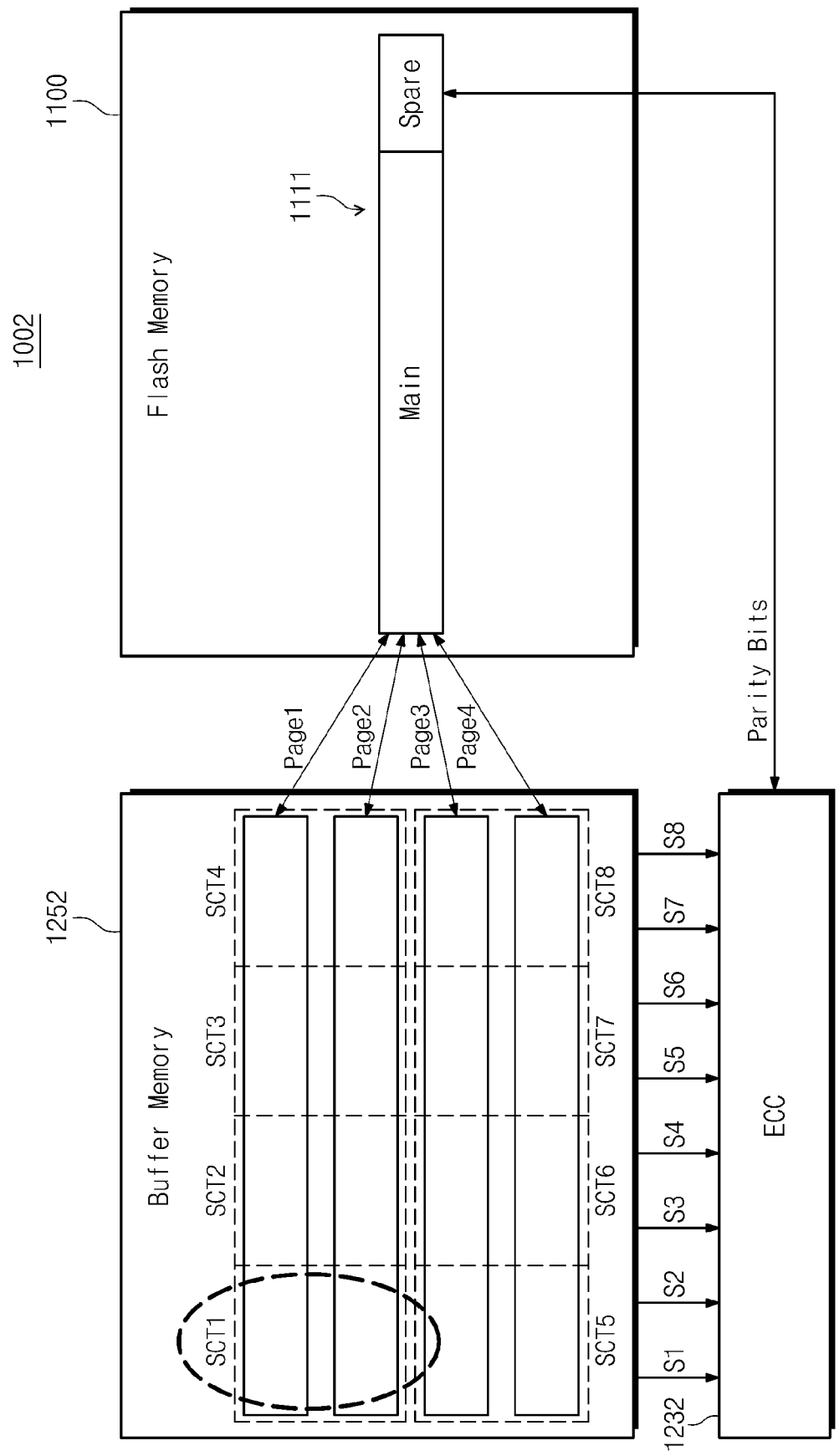
FIGS. 15 and 16 are diagrams for use in describing a partial interleave scheme for reducing BER disproportion according to an embodiment of the inventive concepts.
Figure 16:
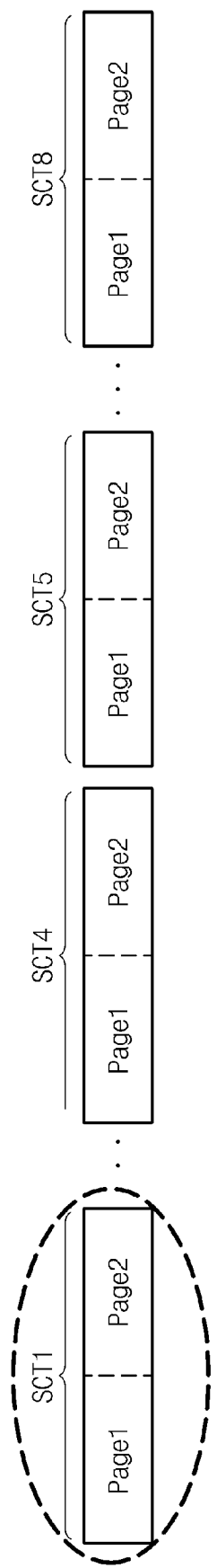

Referring first to FIGS. 15 and 16, the example of this embodiment is characterized by execution of a partial interleave technique of the inventive concepts.

In the illustrated example of a 4-bit MLC flash memory device, the embodiment is characterized by interleaving 2 pages (e.g., Pages 1 and 2) in some sectors (e.g., sectors SCT1~SCT4) of the buffer memory 1252, and interleaving 2 other pages (e.g., Pages 3 and 4) in other sectors (e.g., sectors SCT5~SCT) of the buffer memory 1252. The interleaved data of each sector SCT1~SCT4 of the buffer memory 1252 is utilized as sector data S1~S4 applied to an ECC circuit 1232, and the ECC circuit 1232 generates first parity bits based on the interleaved Page 1/Page 2 data. The first parity bits are then stored in a spare memory area of the flash memory 1100 so as to be associated with the Page 1 and Page 2 data 1111 stored therein. Likewise, the interleaved data of each sector SCT5~SCT8 of the buffer memory 1252 is utilized as sector data S5~S8 applied to the ECC circuit 1232, and the ECC circuit 1232 generates second parity bits based on the interleaved Page 3/Page 4 data. The second parity bits are then stored in a spare memory area of the flash memory 1100 so as to be associated with the Page 3 and Page 4 data 1111 stored therein. When the data is read, the ECC executes error correction of the physical pages based on the first parity bits and second parity bits. In this manner, the Page 1 data and the Page 2 data have the same BER, and the Page 3 and the Page 4 data have the same BER. Namely, in the case of the 4-bit flash memory device, the Page 1/Page 2 BER is (1+2)/2=1.5, and the Page 3/Page 4 BER is (4+8)/2=6.

Since each sector is loaded with two (2) pages of data in the above embodiment, the buffer memory 1232 capacity can be substantially reduced when compared to that required for the interleave scheme of FIG. 9-10. Further, the size of the ECC circuit 1232 can be reduced as well. Further, by adjusting the voltage threshold Vt distributions as described below, the disproportion in BER between Pages 1/2 and Pages 3/4 can be negated. This is described next with reference to FIG. 17.

Figure 17:
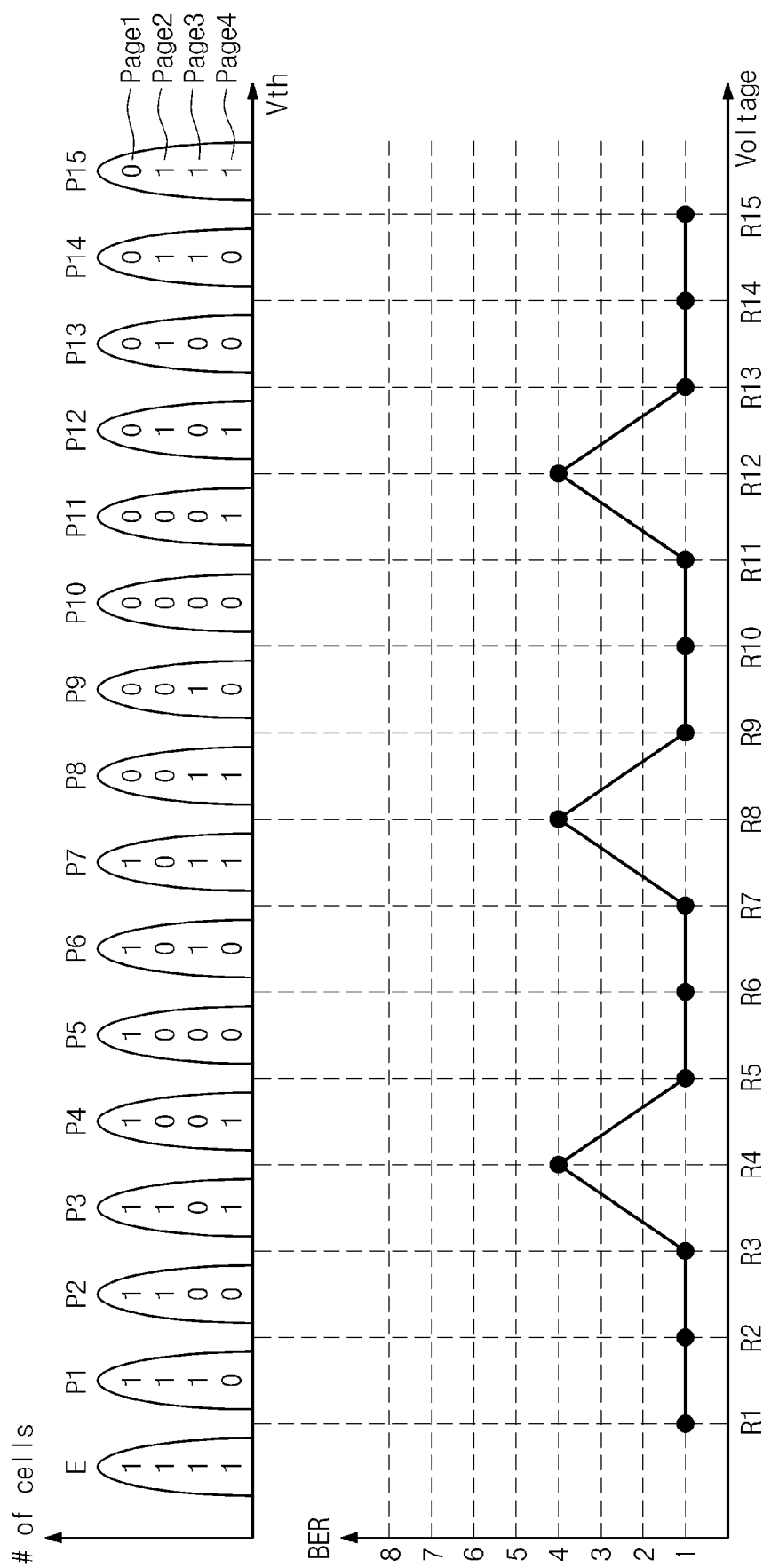
FIG. 17 is a diagram for use in describing the shifting of threshold voltage distributions to reduce BER disproportion according to an embodiment of the inventive concepts.

In the example given above, interleaved Pages 1 and 2 had a BER of 1.5, and interleaved Pages 3 and 4 had a BER of 6. This can be normalized to a BER of 1 for Pages 1-2, and a BER of 4 for Pages 3-4 (i.e., a BER ratio of 1:4). Turning to FIG. 17, by setting the verify read voltages described previously, the Page 1/Page 2 transitions (P3/P4 and P7/P8 and P11/P12) are adjusted such that the BER at each transition is four (4) times greater than that of the remaining Page 3/Page 4 transitions. In other words, the BER at the P3/P4 and P7/P8 and P11/P12 transitions (first group of pages) is increased, and the BER at the remaining transitions (of the second group of pages) is decreased, such that the BER for the first group of pages Page 1/Page 2 is equalized with the BER of the second group of pages Page 3/Page 4. In this particular example, the normalized BER of each page group is (1+2)/2=2.5.

Figure 18:
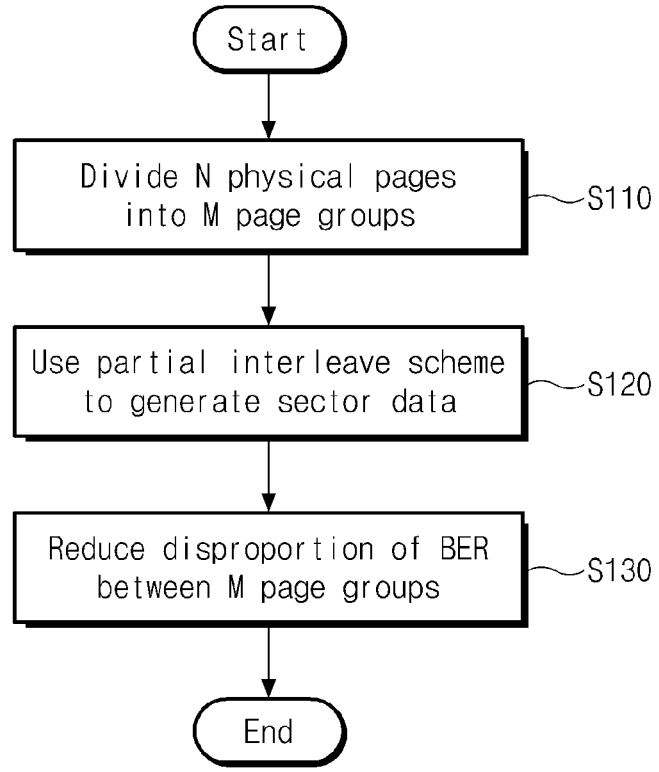
FIG. 18 is a flowchart for use in describing a method of reducing BER disproportion according to an embodiment of the inventive concepts.

FIG. 18 is a flow chart for use in describing a method according to embodiments of the inventive concepts. Initially, as suggested above, N physical pages of data are divided into M groups of pages (S110). For example, four (4) physical pages of data may be divided into two (groups) of pages, where each group includes two (4/2) pages. Next, a partial interleave scheme is executed (S120) where the pages of each of the M groups are interleaved to generate sector data utilized in an ECC process, to thereby reduce or negate a disproportion in BER between pages within each group. Also, the threshold voltage Vt distributions are set so as to reduce or negate a disproportion in BER between the M groups of pages (S130).

Thus, according to the embodiments described above, the BER disproportion can be negated by executing the partial interleave process during ECC, and by adjusting the voltage threshold Vt distributions based on the partially interleaved data. The embodiments allow for a reduced capacity buffer memory when compare to the full interleave process described previously, and the adjustments of voltage threshold Vt distributions are simplified when compared to the technique described previously.

For ease of explanation, the discussion above presents a BER relationship in the related art in which the normalized BER of an $n^{th}$ page is $2^n$, where n equals 0 to (N−1), and N is the total number of pages. However, due to operational and/or process variations (such as burn in), this page relationship of BER can be altered, and the embodiments herein may be altered accordingly. For example, in estimating the BER for each of the N pages in the case where the $2^N-1$ verify voltages are evenly distributed, an embodiment of the inventive concepts includes determining an expected variation resulting from a burn-in process and adjusting the $2^N-1$ verify voltages accordingly. Further, the estimating may further include determining an expected variation resulting from non-randomization of stored data in the MLC memory cells. Still further, program states with a lower threshold voltage may exhibit a wider distribution due to program charge disturbances, which an also impact the BER of each page. Again, the embodiments herein may be altered to account for such variations.

Further, the embodiments above intend to equalize the BER for the N/M pages within each group of pages, and/or to equalize the BER for the M groups of pages. It will be understood that exact matching of BER's in a real world device may not possible, and that the term "equalize" means to reduce the BER disproportion such that the BER values are substantially the same within reasonable limits of process and operational variations.

Still further, the description above states that the threshold voltage Vt distributions can be adjusted or set to reduce the BER disproportion of the M groups of pages. It will be understood that these threshold voltage Vt distributions may be set in advance prior to product shipment, or instead set and/or adjusted after shipment.

Figure 19:
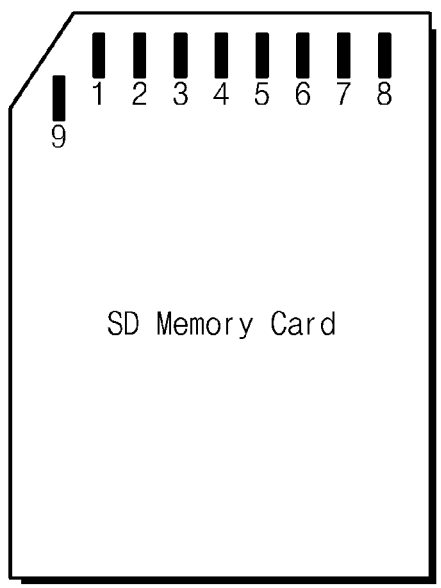
FIGS. 19 and 20 are diagrams illustrating a memory card and a memory card system according to an embodiment of the inventive concepts.
Figure 20:
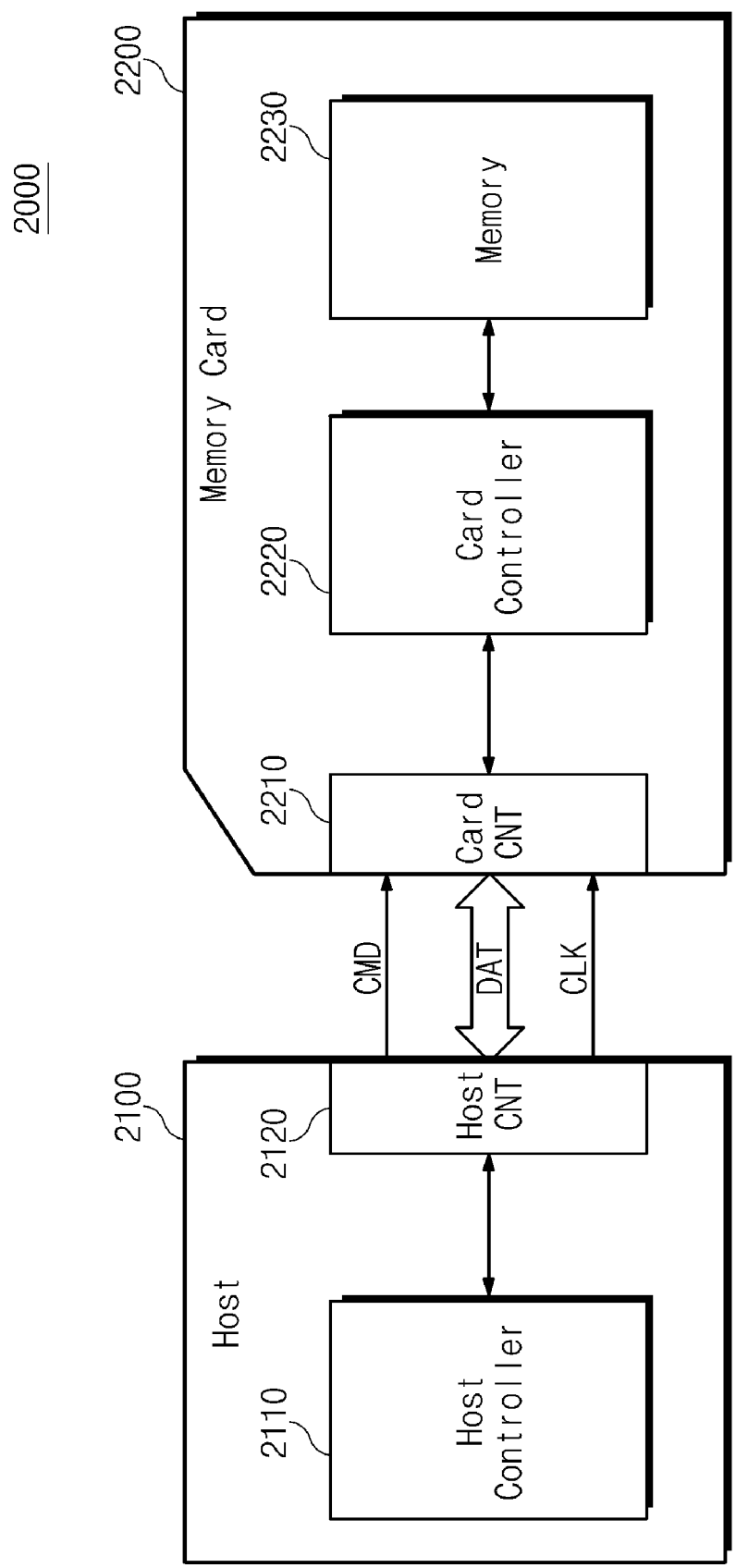

FIGS. 19 and 20 respectively illustrate a perspective view of an SD memory card and a block view of a memory card system in accordance with embodiments of the inventive concepts. The memory card system 2000 includes a memory card 2200 (such as the SD memory card shown in FIG. 19) and a host 2100. The host device 2100 includes a host controller 2110 and a host connector (CNT) 2120. The host controller 2110 includes, for example, a main CPU, DRAM, SRAM, etc., and transmits commands (CMD) and a clock signal (CLK) to the memory card 2200. The memory card includes a nonvolatile memory 2230, a card controller 2220 and a card connector (CNT) 2210. In operation, the memory card 2200 is detachably connected to the host connector 2120 to allow for the exchange of data (DAT) between the host device 2100 and the memory card 2200. Further, the memory controller 2220 is configured in accordance with one or more of the inventive concepts described herein.

Figure 21:
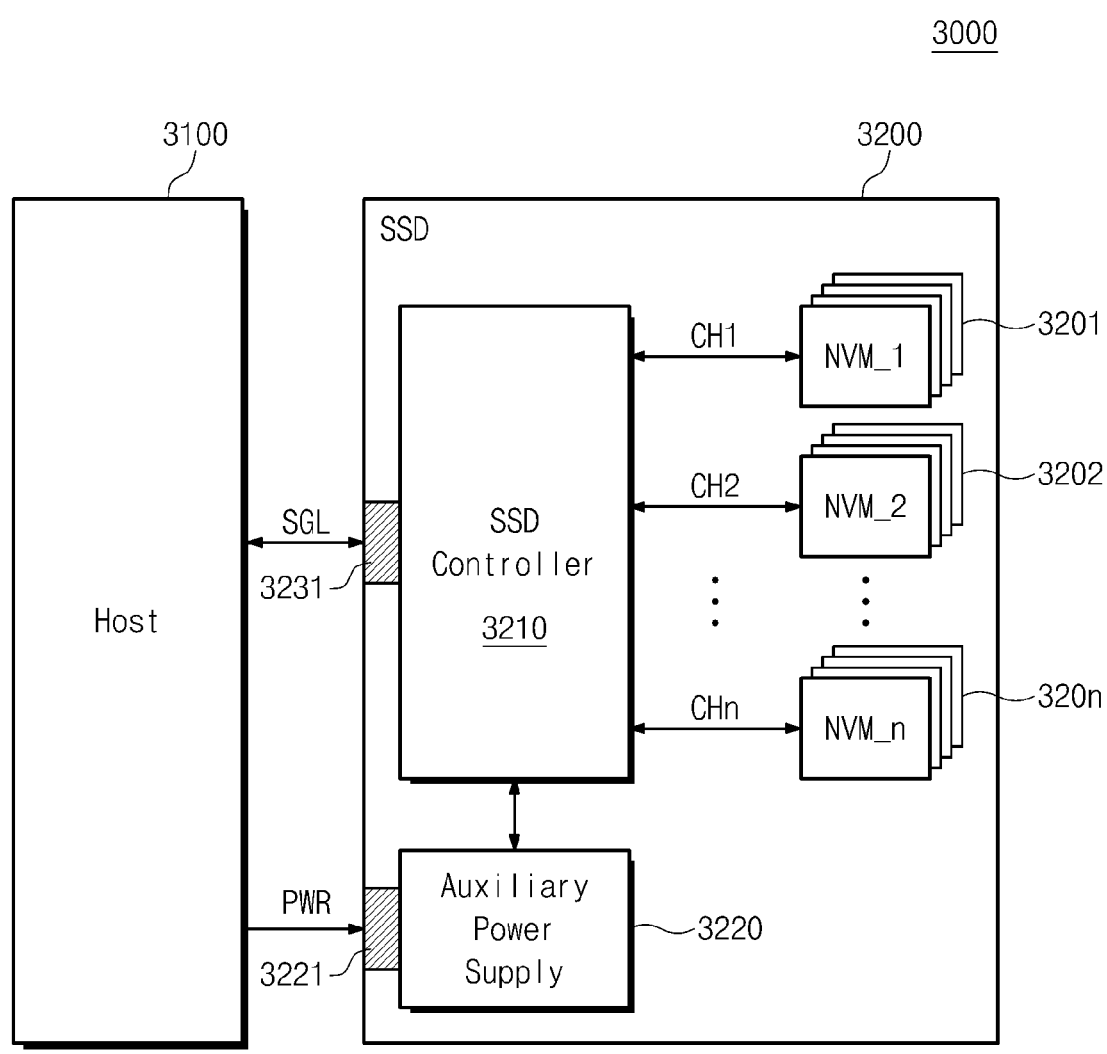
FIGS. 21 and 22 are diagrams illustrating computer system and a memory controller according to an embodiment of the inventive concepts.

FIG. 21 is a block view of another memory system in accordance with embodiments of the inventive concepts. In particular, the memory system of this example includes a host device 3100 and a solid state drive (SSD) 3200. Here, the host device 3100 and the SSD 3200 exchanges signals at signal terminals 3231 of the SSD 3200, and the host device 3100 provides a power signal PWR to an auxiliary power supply terminal 3221 of the SSD 3200. The SSD 3200 includes an SDD controller 3210, and auxiliary power supply 3220, and plural groups 3201~320n of memory chips (NVM), where each memory chip group 3201~320n includes at least one nonvolatile memory chip. The SDD controller 3210 is configured in accordance with one or more of the inventive concepts described herein, and communicates with the memory chip groups 3201~320n over a respective plurality of channels CH1~CHn.

Figure 22:
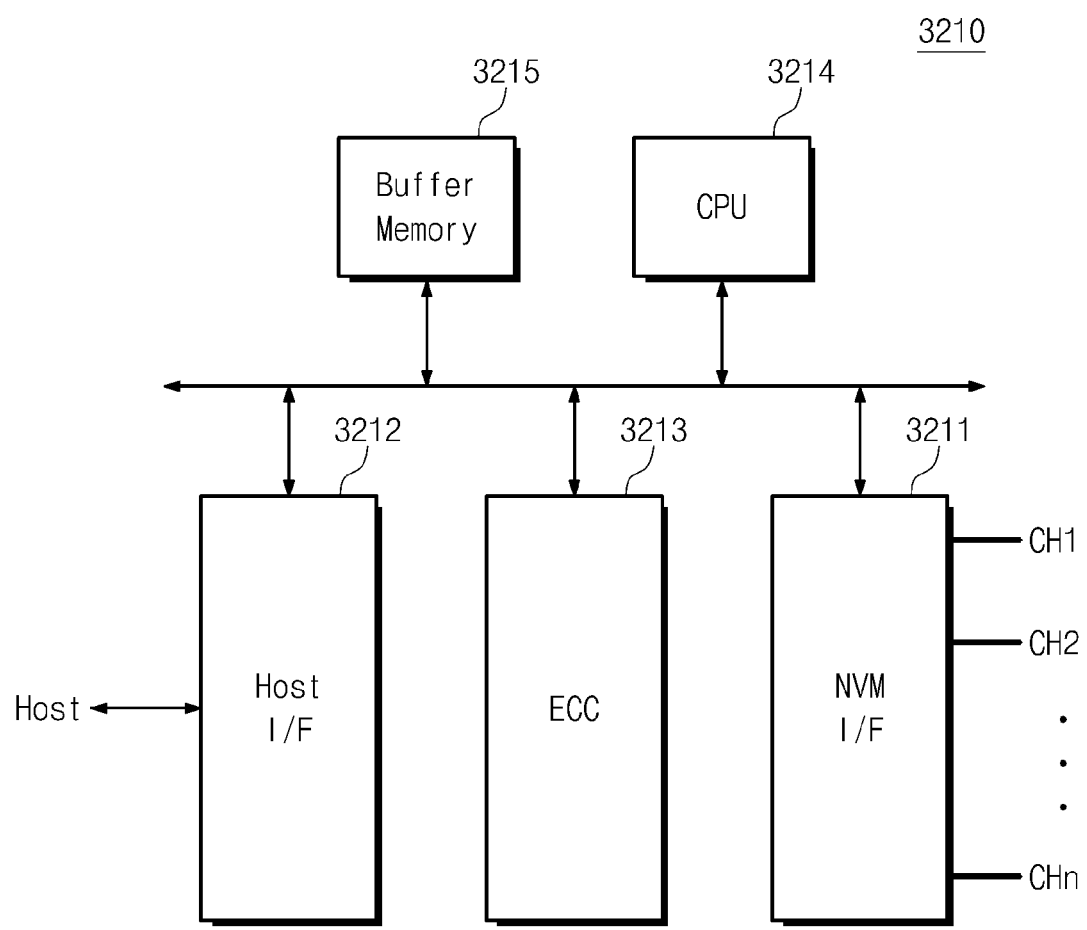

FIG. 22 is a block view of the SDD controller 3200 shown in FIG. 21 in accordance with embodiments of the inventive concepts. This example is similar to the memory controller 1200 of FIG. 4, except that the memory controller 3210 communicates via the nonvolatile memory (NVM) interface 3211 over a plurality of channels CH1 <1:n> with the respective memory chip groups 3201~320n of the nonvolatile memory 3200. Preferably, data is spread out among the memory chip groups, for example, to increase a useful lifespan of the chips groups. The host I/F 3212, the ECC block 3213, the buffer memory 3215 and the CPU 3214 the same or similar to the like-named elements of previously described FIG. 4, and thus a detailed description thereof is omitted here. In this embodiment, the memory controller 3210 is implemented within an SSD, but the inventive concepts are not limited thereto. Also, the CPU 3214 may include multiple central processing units, thus allowing for multitasking and/or parallel processing.

Figure 23:
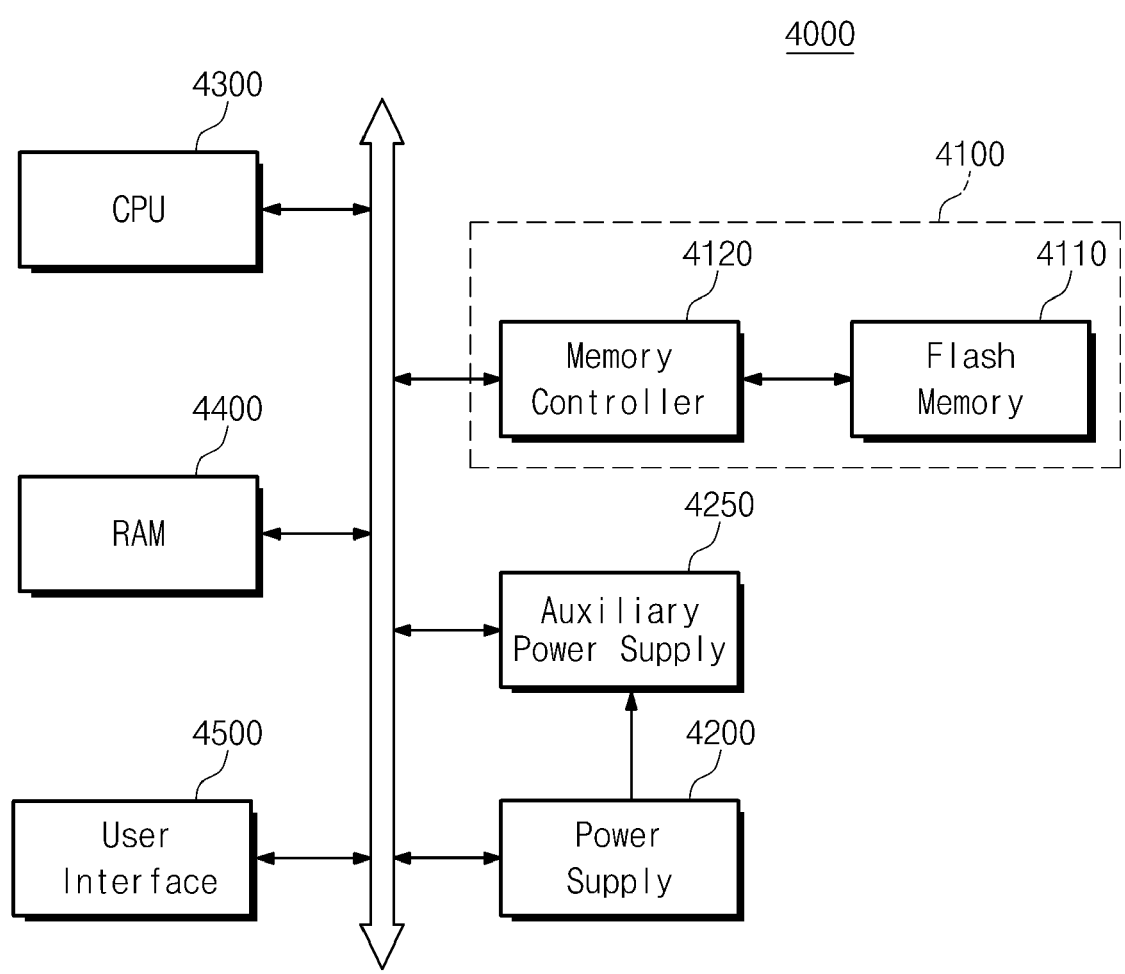
FIG. 23 is a diagram illustrating a computing system according to an embodiment of the inventive concepts.

FIG. 23 is a block view of a computing system in accordance with an embodiment of the inventive concepts. Examples of the computing system 4000 include mobile devices, personal computers, digital cameras, camcorders, cell phones, MP3 players, Portable Multimedia Players (PMPs), Personal Digital Assistants (PDAs), and High Definition Televisions (HDTV). The computing system 4000 of this example includes a central processing unit (CPU) 4300, a user interface 4500, a random access memory (RAM) 4400, a power supply 4200, an auxiliary power supply 4250 and a memory system 4100. The functionality of the CPU 4300, user interface 4500, RAM 4400, power supply 4200, auxiliary power supply 4200 and bus system are well understood by those skilled in the art. The memory system 4100 includes a memory controller 4120 and a flash memory 4110, and may correspond to any of the memory systems described previously herein. Further, the memory controller 4120 is configured according to any one or more of the inventive concepts described herein.

An MLC flash memory in accordance with one or more of the inventive concepts may be housed on or within any of a variety of different package types. For example, a flash memory device in accordance with one or more of the inventive concepts may be housed on or within a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concepts have been particularly shown and described with reference to exemplary embodiments thereof, it will be understood that various changes in form and details may be made therein without departing from the spirit and scope of the following claims.

What is claimed is:

1. A nonvolatile memory, comprising:
a plurality of N-bit multi-level cell (MLC) memory cells for storing N pages of data, each of the MLC memory cells programmable into any one of $2^N$ threshold voltage distributions, where N is a positive number;
a controller configured to program the N pages of data into the MLC memory cells, and to execute a partial interleave process in which the N pages of data are divided into M page groups, where M is a positive number and where each page group includes at least one of the N pages of data, and in which each of the M page groups is applied to an error correction code (ECC) circuit to generate parity bits for the respective M page groups, wherein a bit-error rate (BER) among the pages within each of the M groups is equalized by the partial interleave process.

2. The nonvolatile memory of claim 1, wherein the threshold voltage distributions are set before programming such that the BER of the M groups of pages is equalized.

3. The nonvolatile memory of claim 1, further comprising a buffer memory configured to receive data in units of sectors from an external device, wherein each received sector of data is loaded with one of the M groups of pages.

4. The nonvolatile memory device of claim 2, wherein the data of each sector is applied as sector data to the ECC circuit.

5. The nonvolatile memory of claim 1, wherein each page group includes N/M pages of data.

6. The nonvolatile memory of claim 4, further comprising a buffer memory configured to receive data in units of sectors from an external device, wherein each received sector includes N/M pages of data.

7. The nonvolatile memory of claim 1, wherein N is at least 4, and M is at least 2.

8. The nonvolatile memory of claim 2, wherein the $2^N$ threshold voltage distributions are set before programming by setting $2^N-1$ verify voltages for the $2^N$ threshold voltage distributions to equalize the BER of the M groups of pages.

9. The nonvolatile memory device of claim 1, wherein the plurality of N-bit MLC memory cells are connected to a same word line of a nonvolatile memory cell array.

10. The nonvolatile memory device of claim 1, wherein the N-bit MLC memory cells are programmed by Fowler-Nordheim tunneling.

11. A method of setting threshold voltage distributions in a nonvolatile memory including N-bit multi-level cell (MLC) memory cells for storing N pages of data, where N is a positive number, each of the N-bit MLC memory cells programmable into any one of $2^N$ threshold voltage distributions, said method comprising:
dividing the N pages into M groups of pages, where M is a positive number;
setting $2^N-1$ verify voltages associated with the $2^N$ threshold voltage distributions to equalize the average bit-error-rate (BER) of the M groups of pages;
programming the N pages of data into the N-bit MLC memory cells using the set $2^N-1$ verify voltages; and
executing a partial interleave process in which each of the M page groups is applied to an error correction code (ECC) circuit to generate parity bits for the respective M page groups, wherein a bit-error rate (BER) among the pages within each of the M groups is equalized by the partial interleave process.

12. The method of claim 11, further comprising estimating in advance a BER for each of the N pages of data in the case where the $2^N-1$ verify voltages are evenly distributed; and
adjusting at least one of the $2^N-1$ verify voltages to equalize the average bit-error-rate (BER) of the M groups of pages.

13. The method of claim 12, wherein the estimating includes determining an expected variation in at least one of the $2^N$ threshold voltage distributions resulting from a burn-in process.

14. The method of claim 12, wherein the estimating includes determining an expected variation in at least one of the $2^N$ threshold voltage distributions resulting from non-randomization of data stored in the MLC memory cells.

15. The method of claim 11, wherein N is at least 4, and M is at least 2.

16. The method of claim 11, wherein the plurality of N-bit MLC memory cells are connected to a same word line of a nonvolatile memory cell array.

17. The method of claim 15, wherein the N-bit MLC memory cells are programmed by Fowler-Nordheim tunneling.

18. A memory system comprising:
a nonvolatile memory comprising a control logic, an address decoder, and a memory cell array, the memory cell array comprising rows and columns of N-bit multi-level cell (MLC) memory cells, wherein each row of MLC memory cells is configured to stored N pages of data;
a memory controller including a host interface for interfacing with an external device, a memory interface for interfacing with the nonvolatile memory, a central processing unit, a buffer memory, and an error correction code (ECC) circuit,
the memory controller configured to execute a partial interleave process in which the N pages of data are divided into M page groups, where M is a positive number and where each page group includes at least one of the N pages of data, and in which each of the M page groups is applied to the ECC circuit to generate parity bits for the respective M page groups, wherein a bit-error rate (BER) among the pages within each of the M groups is equalized by the partial interleave process.

19. The memory system of claim 18, wherein each of the N-bit MLC memory cells programmable into any one of $2^N$ threshold voltage distributions, and where the threshold voltage distributions are set before programming such that the BER of the M groups of pages is equalized.

20. The memory system of claim 18, further comprising a buffer memory configured to receive data in units of sectors from an external device, wherein each received sector of data is loaded with one of the M groups of pages.

21. The memory system of claim 18, wherein the N-bit MLC memory cells are programmed by Fowler-Nordheim tunneling.

22. The memory system of claim 18, wherein the memory system is a solid state drive (SSD), and wherein the nonvolatile memory includes a plurality of nonvolatile memory chip and a plurality of data channels between the memory controller and the nonvolatile memory chips.

23. The memory system of claim 18, wherein the memory system is a memory card.

* * * * *